(12) United States Patent
Hikosaka et al.

(10) Patent No.: US 10,505,030 B2
(45) Date of Patent: Dec. 10, 2019

(54) SEMICONDUCTOR DEVICE AND METHOD FOR MANUFACTURING THE SAME

(71) Applicant: Kabushiki Kaisha Toshiba, Minato-ku (JP)

(72) Inventors: Toshiki Hikosaka, Kawasaki (JP); Shigeya Kimura, Yokohama (JP); Shinya Nunoue, Ichikawa (JP); Masahiko Kuraguchi, Yokohama (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 15/893,932

(22) Filed: Feb. 12, 2018

(65) Prior Publication Data

US 2018/0374942 A1    Dec. 27, 2018

(30) Foreign Application Priority Data

Jun. 22, 2017   (JP) ................................ 2017-122439

(51) Int. Cl.
  *H01L 29/778*  (2006.01)
  *H01L 29/66*  (2006.01)
  (Continued)

(52) U.S. Cl.
  CPC ...... *H01L 29/7783* (2013.01); *H01L 29/0688* (2013.01); *H01L 29/1054* (2013.01); *H01L 29/1095* (2013.01); *H01L 29/4236* (2013.01); *H01L 29/66431* (2013.01); *H01L 29/66462* (2013.01); *H01L 29/7786* (2013.01)

(58) Field of Classification Search
  USPC ........................................................ 257/194
  See application file for complete search history.

(56) References Cited

U.S. PATENT DOCUMENTS

| 8,674,407 B2 | 3/2014 | Ando et al. |
| 9,960,264 B1 * | 5/2018 | Chen .................. H01L 29/7786 |

(Continued)

FOREIGN PATENT DOCUMENTS

| JP | 2001-196575 | 7/2001 |
| JP | 2011-523218 | 8/2011 |

(Continued)

*Primary Examiner* — Nilufa Rahim
(74) *Attorney, Agent, or Firm* — Oblon, McClelland, Maier & Neustadt, L.L.P.

(57) ABSTRACT

According to one embodiment, a semiconductor device includes first to third electrodes, and first to third semiconductor regions. The third electrode is separated from the second electrode in a first direction. The first semiconductor region includes a first partial region separated from the first electrode, a second partial region separated from the second electrode, and a third partial region separated from the third electrode. The second semiconductor region includes a fourth partial region positioned between the first electrode and the first partial region, a fifth partial region positioned between the second electrode and the second partial region, and a sixth partial region positioned between the third electrode and the third partial region. The third semiconductor region includes a seventh partial region positioned between the second electrode and the fifth partial region and an eighth partial region positioned between the third electrode and the sixth partial region.

18 Claims, 4 Drawing Sheets

(51) Int. Cl.
*H01L 29/10* (2006.01)
*H01L 29/423* (2006.01)
*H01L 29/06* (2006.01)

(56) References Cited

U.S. PATENT DOCUMENTS

| | | | |
|---|---|---|---|
| 2001/0020700 A1 | 9/2001 | Inoue et al. | |
| 2008/0164527 A1* | 7/2008 | Kataoka | H01L 29/155 257/356 |
| 2016/0300941 A1* | 10/2016 | Cheng | H01L 29/4236 |
| 2017/0222032 A1* | 8/2017 | Liu | H01L 29/7787 |
| 2018/0294341 A1* | 10/2018 | Chen | H01L 29/42376 |

FOREIGN PATENT DOCUMENTS

| | | |
|---|---|---|
| JP | 2012-231002 | 11/2012 |
| JP | 5325534 | 10/2013 |
| JP | 2015-204359 | 11/2015 |
| JP | 5809802 | 11/2015 |
| JP | 2017-502519 | 1/2017 |

\* cited by examiner

SEMICONDUCTOR DEVICE AND METHOD FOR MANUFACTURING THE SAME

CROSS-REFERENCE TO RELATED APPLICATIONS

This application is based upon and claims the benefit of priority from Japanese Patent Application No. 2017-122439, filed on Jun. 22, 2017; the entire contents of which are incorporated herein by reference.

FIELD

Embodiments described herein relate generally to a semiconductor device and a method for manufacturing the same.

BACKGROUND

For example, there is a semiconductor device such as a transistor or the like that uses a nitride semiconductor. It is desirable to reduce the on-resistance of the semiconductor device.

DETAILED DESCRIPTION

Figure 1:
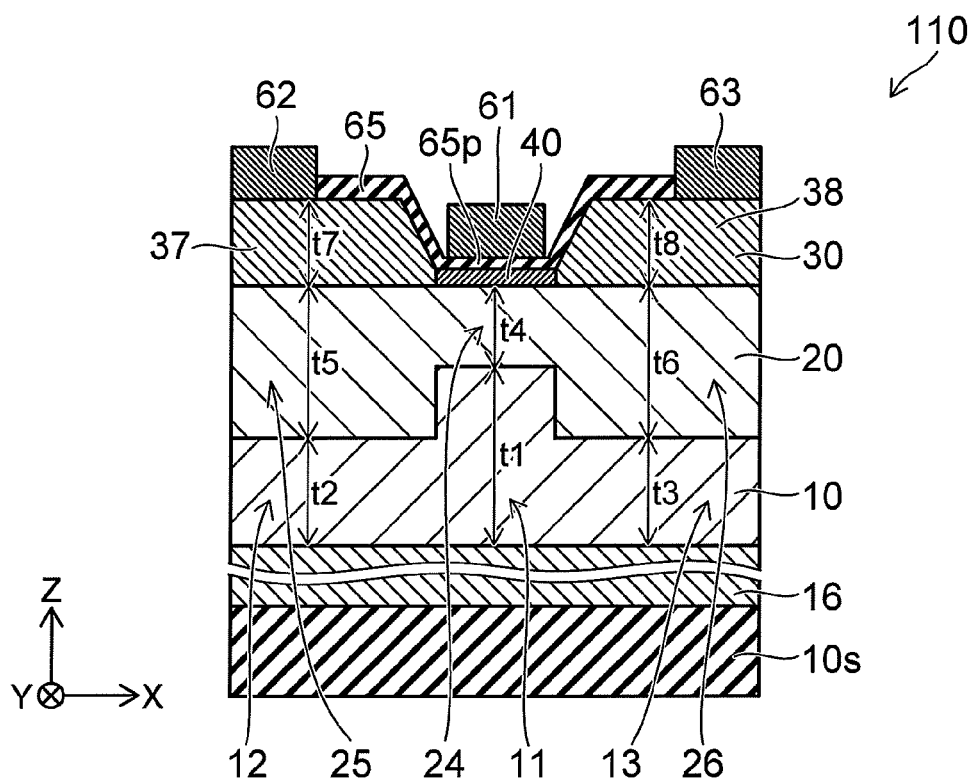
FIG. 1 is a schematic cross-sectional view illustrating a semiconductor device according to a first embodiment.

According to one embodiment, a semiconductor device includes first to third electrodes, and first to third semiconductor regions. The third electrode is separated from the second electrode in a first direction. A position in the first direction of the first electrode is between a position in the first direction of the second electrode and a position in the first direction of the third electrode. The first semiconductor region includes $Al_{x1}Ga_{1-x1}N$ ($0 < x1 \le 1$). The first semiconductor region includes a first partial region, a second partial region, and a third partial region. The first partial region is separated from the first electrode in a second direction crossing the first direction. The second partial region is separated from the second electrode in the second direction. The third partial region is separated from the third electrode in the second direction. A first thickness along the second direction of the first partial region is thicker than a second thickness along the second direction of the second partial region and thicker than a third thickness along the second direction of the third partial region. The second semiconductor region includes $Al_{x2}Ga_{1-x2}N$ ($0 \le x2 < 1$ and $x2 < x1$). The second semiconductor region includes a fourth partial region, a fifth partial region, and a sixth partial region. The fourth partial region is positioned between the first electrode and the first partial region in the second direction. The fifth partial region is positioned between the second electrode and the second partial region in the second direction. The sixth partial region is positioned between the third electrode and the third partial region in the second direction. A fourth thickness along the second direction of the fourth partial region is thinner than a fifth thickness along the second direction of the fifth partial region and thinner than a sixth thickness along the second direction of the sixth partial region. The third semiconductor region includes $Al_{x3}Ga_{1-x3}N$ ($0 < x3 \le 1$ and $x2 < x3$). The third semiconductor region includes a seventh partial region and an eighth partial region. The seventh partial region is positioned between the second electrode and the fifth partial region in the second direction. The eighth partial region is positioned between the third electrode and the sixth partial region in the second direction.

According to another embodiment, a semiconductor device includes a first electrode, a second electrode, a third electrode, a first semiconductor region, a second semiconductor region, a third semiconductor region. The third electrode is separated from the second electrode in a first direction. A position in the first direction of the first electrode is between a position in the first direction of the second electrode and a position in the first direction of the third electrode. The first semiconductor region includes $Al_{x1}Ga_{1-x1}N$ ($0 < x1 \le 1$). The first semiconductor region includes a first partial region, a second partial region, and a third partial region. The first partial region is separated from the first electrode in a second direction crossing the first direction. The second partial region is separated from the second electrode in the second direction. The third partial region is separated from the third electrode in the second direction. The second semiconductor region includes $Al_{x2}Ga_{1-x2}N$ ($0 \le x2 < 1$ and $x2 < x1$). The second semiconductor region includes a fourth partial region, a fifth partial region, and a sixth partial region. The fourth partial region is positioned between the first electrode and the first partial region in the second direction. The fifth partial region is positioned between the second electrode and the second partial region in the second direction. The sixth partial region is positioned between the third electrode and the third partial region in the second direction. The third semiconductor region includes $Al_{x3}Ga_{1-x3}N$ ($0 < x3 \le 1$ and $x2 < x3$). The third semiconductor region includes a seventh partial region and an eighth partial region. The seventh partial region is positioned between the second electrode and the fifth partial region in the second direction. The eighth partial region is positioned between the third electrode and the sixth partial region in the second direction. A portion of the first partial region is positioned between the fifth partial region and the sixth partial region in the first direction.

According to another embodiment, a method is disclosed for manufacturing a semiconductor device. The method can include removing a portion of a second semiconductor film and a portion of a first semiconductor film to form a first semiconductor region from the first semiconductor film by using a mask provided on a portion of a stacked body including the first semiconductor film and the second semiconductor film. The first semiconductor film includes $Al_{x1}Ga_{1-x1}N$ ($0 < x1 \le 1$). The second semiconductor film includes $Al_{x2}Ga_{1-x2}N$ ($0 \le x2 < 1$ and $x2 < x1$) and is provided on the first semiconductor film. The first semiconductor region includes first to third partial regions. A portion of the first partial region is positioned between the second partial region and the third partial region in a first direction. The first direction crosses a second direction. The second direction is from the first semiconductor film toward the second semiconductor film. The method can include forming a fifth partial region and a sixth partial region. The fifth partial region includes $Al_{x2}Ga_{1-x2}N$ (0≤x2<1 and x2<x1) and is positioned on the second partial region. The sixth partial region includes $Al_{x2}Ga_{1-x2}N$ (0≤x2<1 and x2<x1) and being positioned on the third partial region. The method can include forming a seventh partial region and an eighth partial region. The seventh partial region includes $Al_{x3}Ga_{1-x3}N$ (0<x3≤1 and x2<x3) and is positioned on the fifth partial region. The eighth partial region includes $Al_{x3}Ga_{1-x3}N$ (0<x3≤1 and x2<x3) and is positioned on the sixth partial region. In addition, the method can include removing the mask, forming an insulating film on another portion of the second semiconductor film, and forming a first electrode, a second electrode, and a third electrode. The first electrode is positioned on the insulating film. The second electrode is positioned on the seventh partial region. The third electrode is positioned on the eighth partial region.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

First Embodiment

FIG. 1 is a schematic cross-sectional view illustrating a semiconductor device according to a first embodiment.

As shown in FIG. 1, the semiconductor device 110 according to the embodiment includes first to third electrodes 61 to 63, a first semiconductor region 10, a second semiconductor region 20, and a third semiconductor region 30. An insulating film 65 is further provided in the example.

The third electrode 63 is separated from a second electrode 62 in a first direction.

The first direction is taken as an X-axis direction. One axis perpendicular to the X-axis direction is taken as a Z-axis direction. A direction perpendicular to the X-axis direction and the Z-axis direction is taken as a Y-axis direction.

The first electrode 61 is positioned between the second electrode 62 and the third electrode 63 in the first direction (the X-axis direction).

For example, the position in the first direction of the first electrode 61 is between the position in the first direction of the second electrode 62 and the position in the first direction of the third electrode 63.

The first semiconductor region 10 includes $Al_{x1}Ga_{1-x1}N$ (0<x1≤1). The first semiconductor region is AlGaN.

The first semiconductor region 10 is separated in the second direction from these electrodes. The second direction crosses the first direction. The second direction is, for example, the Z-axis direction. The first semiconductor region 10 includes a first partial region 11, a second partial region 12, and a third partial region 13. The first partial region 11 is separated from the first electrode 61 in the second direction. The second partial region 12 is separated from the second electrode 62 in the second direction. The third partial region 13 is separated from the third electrode 63 in the second direction. These partial regions are continuous with each other.

A first thickness t1 along the second direction of the first partial region 11 is thicker than a second thickness t2 along the second direction of the second partial region 12. The first thickness t1 is thicker than a third thickness t3 along the second direction of the third partial region 13. The first semiconductor region 10 has a protrusion (the first partial region 11).

The second semiconductor region 20 includes $Al_{x2}Ga_{1-x2}N$ (0≤x2<1 and x2<x1). The second semiconductor region 20 is, for example, GaN. The impurity concentration in the second semiconductor region 20 is, for example, $10^{17}/cm^3$ or less. The impurity is, for example, silicon (Si) or carbon (C). The second semiconductor region 20 is, for example, i-GaN.

The second semiconductor region 20 includes a fourth partial region 24, a fifth partial region 25, and a sixth partial region 26. The fourth partial region 24 is positioned between the first electrode 61 and the first partial region 11 in the second direction. The fifth partial region 25 is positioned between the second electrode 62 and the second partial region 12 in the second direction. The sixth partial region 26 is positioned between the third electrode 63 and the third partial region 13 in the second direction.

A fourth thickness t4 along the second direction of the fourth partial region 24 is thinner than a fifth thickness t5 along the second direction of the fifth partial region 25. The fourth thickness t4 is thinner than a sixth thickness t6 along the second direction of the sixth partial region 26.

In the embodiment, a portion of the first partial region 11 is positioned between the fifth partial region 25 and the sixth partial region 26 in the first direction (the X-axis direction).

The third semiconductor region 30 includes $Al_{x3}Ga_{1-x3}N$ (0<x3≤1 and x2<x3). The third semiconductor region 30 is, for example, AlGaN. The third semiconductor region 30 includes a seventh partial region 37 and an eighth partial region 38. The seventh partial region 37 is positioned between the second electrode 62 and the fifth partial region 25 in the second direction. The eighth partial region 38 is positioned between the third electrode 63 and the sixth partial region 26 in the second direction.

The insulating film 65 includes a portion 65p provided between the first electrode 61 and the fourth partial region 24 in the second direction.

A fourth semiconductor region 40 is provided in the example. The fourth semiconductor region 40 is provided between the first electrode 61 and the fourth partial region 24 in the second direction. The fourth semiconductor region 40 includes $Al_{x4}Ga_{1-x4}N$ (0<x4≤1 and x2<x4). In such a case, the insulating film 65 includes the portion 65p provided between the first electrode 61 and the fourth semiconductor region 40 in the second direction.

A substrate 10s and a sixth semiconductor region 16 are further provided in the example. The sixth semiconductor region 16 includes a nitride semiconductor including Al. The sixth semiconductor region 16 is positioned between the substrate 10s and the first semiconductor region 10 in the second direction. The sixth semiconductor region 16 contacts the substrate 10s and the first semiconductor region 10. The sixth semiconductor region 16 includes, for example, multiple AlN films and multiple AlGaN films stacked into a structure. For example, in the multiple AlGaN films, the composition ratio of Al decreases in stages from the substrate 10s side toward the first semiconductor region 10 side. For example, the composition ratio of Al of the multiple AlGaN films is greater than 0 and not more than 1.

For example, the sixth semiconductor region 16 recited above is formed by crystal growth on the substrate 10s; and the first semiconductor region 10 is formed by crystal growth on the sixth semiconductor region 16. The sixth semiconductor region 16 is, for example, a buffer layer.

For example, the second electrode 62 is electrically connected to the seventh partial region 37. The second electrode 62 has an ohmic contact with the seventh partial region 37. The third electrode 63 is electrically connected to the eighth partial region 38. The third electrode 63 has an ohmic contact with the eighth partial region 38. The second electrode 62 functions as, for example, a source electrode. The third electrode 63 functions as, for example, a drain electrode. The first electrode 61 functions as, for example, a gate electrode. The insulating film 65 functions as, for example, a gate insulating film. The semiconductor device 110 is, for example, a transistor.

Under the gate electrode of the semiconductor device 110, the thin fourth partial region 24 (e.g., the GaN film) is provided on the thick first partial region 11 (e.g., the AlGaN film). Therefore, the occurrence of a two-dimensional electron gas (2-Dimensional Electron Gas (2 DEG)) under the gate electrode is suppressed. Thereby, the leakage current in the off-state can be suppressed. In other words, a good normally-off characteristic is obtained.

On the other hand, a thick GaN film (the fifth partial region 25 and the sixth partial region 26) is provided in the portions other than under the gate electrode. Therefore, for example, the two-dimensional electron gas occurs easily in the vicinity portion of the interface between the fifth partial region 25 and the seventh partial region 37 and the vicinity portion of the interface between the sixth partial region 26 and the eighth partial region 38. Therefore, the current flows easily in the on-state. The on-resistance can be reduced.

According to the embodiment, the on-resistance can be reduced. A high threshold voltage is obtained. A good normally-off characteristic is obtained.

Figure 2:
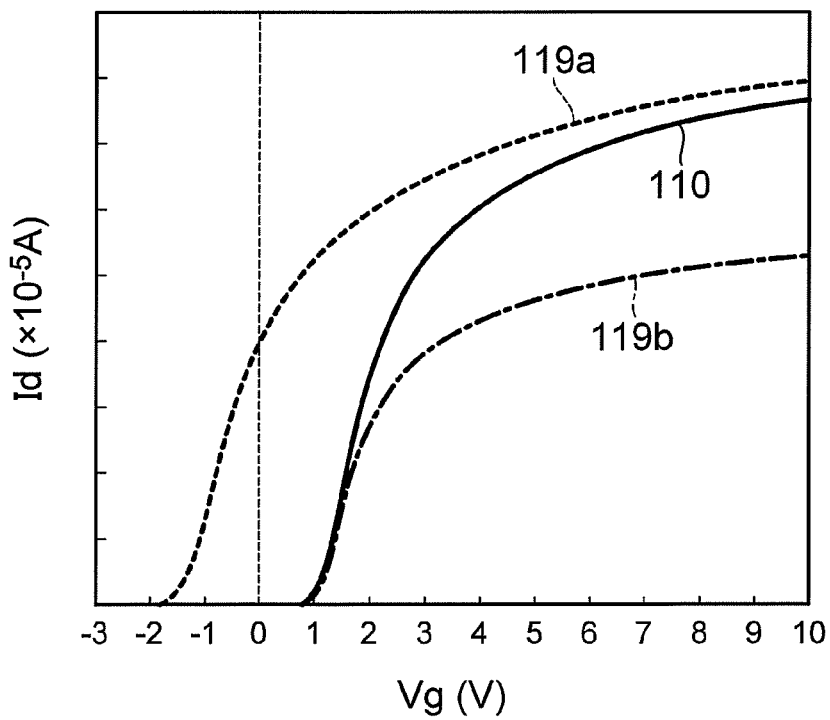
FIG. 2 is a graph illustrating a characteristic of the semiconductor device.

FIG. 2 is a graph illustrating a characteristic of the semiconductor device.

A characteristic of a semiconductor device 119a of a first reference example and a characteristic of a semiconductor device 119b of a second reference example also are illustrated in FIG. 2.

The first semiconductor region 10 is not provided in the semiconductor device 119a. The thicknesses are the same for the fourth partial region 24, the fifth partial region 25, and the sixth partial region 26 of the second semiconductor region 20.

The first semiconductor region 10 is provided in the semiconductor device 119b. The thicknesses are the same for the first partial region 11, the second partial region 12, and the third partial region 13 of the first semiconductor region 10. The thicknesses are the same for the fourth partial region 24, the fifth partial region 25, and the sixth partial region 26 of the second semiconductor region 20.

The horizontal axis of FIG. 2 is a gate voltage Vg (V). The vertical axis is a drain current Id ($\times 10^{-5}$ A). The drain voltage is 1 V in FIG. 2.

In the semiconductor device 119a of the first reference example as shown in FIG. 2, a large drain current Id flows when the gate voltage Vg is 0 V. In other words, a normally-off operation is not possible. It is considered that this is caused by the two-dimensional electron gas forming under the gate electrode in the semiconductor device 119a.

In the semiconductor device 119b of the second reference example, the drain current Id is small when the gate voltage Vg is 0 V. A normally-off operation is obtained. It is considered that this is because the formation of the two-dimensional electron gas under the gate electrode is suppressed. However, the drain current Id in the on-state is small in the semiconductor device 119b. It is considered that this is because the formation of the two-dimensional electron gas is suppressed also at the portions other than under the gate electrode.

Conversely, in the semiconductor device 110 according to the embodiment, the drain current Id is small when the gate voltage Vg is 0 V. A good normally-off operation is obtained. The drain current Id in the on-state is large. A low on-resistance is obtained. It is considered that this is because the formation of the two-dimensional electron gas at the portion under the gate electrode is suppressed, and the two-dimensional electron gas is formed at the portions other than under the gate electrode.

Thus, according to the embodiment, the on-resistance can be reduced. A high threshold voltage is obtained. A good normally-off characteristic is obtained.

In the semiconductor device 110, the protrusion (the first partial region 11) is provided in the first semiconductor region 10. Thereby, for example, in the off-state, a current (a leakage current) that flows through a path between the second electrode 62 and the third electrode 63 can be suppressed. The path of the leakage current includes a portion along the X-axis direction. For example, the path is interrupted by the protrusion (the first partial region 11). In the semiconductor device 110, the leakage current can be suppressed.

It is favorable for the composition ratio x1 of Al in the first semiconductor region 10 to be, for example, not less than 0.05 and not more than 0.3. By such a composition ratio of Al in the first semiconductor region 10, for example, the threshold voltage can be set to be large.

It is favorable for the composition ratio x2 of Al in the second semiconductor region 20 to be, for example, not less than 0 and not more than 0.15. By such a composition ratio of Al in the second semiconductor region 20, for example, the drain current Id can be set to be large.

It is favorable for the composition ratio x3 of Al in the third semiconductor region 30 to be, for example, not less than 0.15 and not more than 0.5. By such a composition ratio of Al in the third semiconductor region 30, for example, the drain current Id can be set to be large.

In the third semiconductor region 30, it is favorable for a seventh thickness t7 along the second direction of the seventh partial region 37 to be, for example, not less than 5 nm and not more than 50 nm. Thereby, for example, the drain current Id can be set to be large. Similarly, it is favorable for an eighth thickness t8 along the second direction of the eighth partial region 38 of the third semiconductor region 30 to be, for example, not less than 5 nm and not more than 50 nm.

In the embodiment, it is favorable for the fourth thickness t4 of the fourth partial region 24 to be, for example, not less than 0.1 times and not more than 0.5 times the fifth thickness t5 of the fifth partial region 25. In the case where the fourth thickness t4 is thinner than 0.1 times the fifth thickness t5, for example, the resistance of the on-operation easily becomes high at the portion under the gate electrode. Therefore, the on-resistance easily becomes high. In the case where the fourth thickness t4 is thicker than 0.5 times the fifth thickness t5, for example, the two-dimensional electron gas concentration difference becomes small between the portion under the gate electrode and the portions other than under the gate electrode. Therefore, the on-resistance easily becomes high. It is favorable for the fourth thickness t4 to be, for example, not less than 0.1 times and not more than 0.5 times the sixth thickness t6 of the sixth partial region 26.

In the embodiment, it is favorable for the fourth thickness t4 of the fourth partial region 24 to be, for example, not less than 20 nm and not more than 500 nm. In the case where the fourth thickness t4 of the fourth partial region 24 is thinner than 20 nm, for example, the resistance of the on-operation easily becomes high at the portion under the gate electrode. Therefore, the on-resistance easily becomes high. In the case where the fourth thickness t4 of the fourth partial region 24 is thicker than 500 nm, for example, the two-dimensional electron gas is formed easily at the portion under the gate electrode. Therefore, a normally-off operation is not obtained easily.

In the embodiment, it is favorable for the first thickness t1 of the first partial region 11 to be not less than 2 times and not more than 10 times the second thickness t2 of the second partial region 12. In the case where the first thickness t1 is thinner than 2 times the second thickness t2, for example, the suppression effect of the current (the leakage current) flowing through the path between the second electrode 62 and the third electrode 63 in the off-state is small. In the case where the first thickness t1 is thicker than 10 times the second thickness t2, the current (the leakage current) that flows through the path between the second electrode 62 and the third electrode 63 in the off-state increases easily. It is favorable for the first thickness t1 to be, for example, not less than 2 times and not more than 10 times the third thickness t3 of the third partial region 13.

In the embodiment, it is favorable for the first thickness t1 of the first partial region 11 to be, for example, not less than 50 nm and not more than 1000 nm. In the case where the first thickness t1 of the first partial region 11 is thinner than 50 nm, for example, the two-dimensional electron gas is formed easily at the portion under the gate electrode. Therefore, a normally-off operation is not obtained easily. In the case where the first thickness t1 of the first partial region 11 is thicker than 1000 nm, for example, the resistance of the on-operation easily becomes high at the portion under the gate electrode. Therefore, the on-resistance easily becomes high.

In the case where the fourth semiconductor region 40 is provided, it is favorable for the composition ratio of Al in the fourth semiconductor region 40 to be lower than the composition ratio of Al in the third semiconductor region 30. For example, the composition ratio x4 is lower than the composition ratio x3. For example, the composition ratio of Al in the fourth semiconductor region 40 may be not more than the composition ratio of Al in the third semiconductor region 30. For example, the composition ratio x4 is not more than the composition ratio x3. The composition ratio x4 is, for example, not less than 0.1 and not more than 0.3. In the case of such a composition ratio, for example, the channel resistance of the portion under the gate electrode is low. For example, a low characteristic on-resistance is obtained.

The thickness along the second direction (the Z-axis direction) of the fourth semiconductor region 40 is, for example, not less than 2 nm and not more than 10 nm. In the case of such a thickness, for example, a normally-off operation is obtained easily.

The substrate 10s includes, for example, a silicon substrate, a sapphire substrate, a SiC substrate, a GaN substrate, etc. A nitride semiconductor layer that has good crystalline quality can be formed on the substrate 10s.

The sixth semiconductor region 16 may include, for example, a superlattice. For example, AlGaN and AlN are stacked periodically in the superlattice. The sixth semiconductor region 16 may be, for example, a buffer layer.

The first semiconductor region 10 may be a portion of the buffer layer (the sixth semiconductor region 16).

The insulating film 65 includes, for example, at least one selected from the group consisting of $SiO_2$, $Al_2O_3$, AlN, $Ga_2O_3$, and AlON. The insulating film 65 includes, for example, at least one selected from the group consisting of oxide, nitride, and oxynitride.

An example of a method for manufacturing the semiconductor device 110 will now be described.

FIG. 3A to FIG. 3F are schematic cross-sectional views in order of the processes, illustrating the method for manufacturing the semiconductor device according to the embodiment.

Figure 3A:
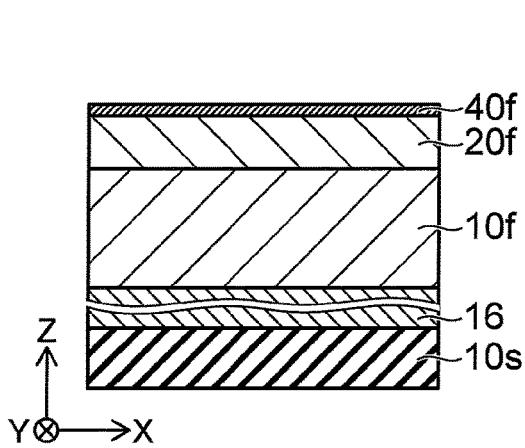
FIG. 3A to FIG. 3F are schematic cross-sectional views in order of the processes, illustrating the method for manufacturing the semiconductor device according to the embodiment.

A stacked body SB is prepared as shown in FIG. 3A. The stacked body SB includes a first semiconductor film 10f including $Al_{x1}Ga_{1-x1}N$ (0<x1≤1), and a second semiconductor film 20f including $Al_{x2}Ga_{1-x2}N$ (0≤x2<1 and x2<x1) and being provided on the first semiconductor film 10f. In the example, the sixth semiconductor region 16 that is used to form a buffer layer is formed on the substrate 10s; and the first semiconductor film 10f and the second semiconductor film 20f are formed on the sixth semiconductor region 16. These semiconductor regions and semiconductor films are formed by epitaxial growth.

In the example, the stacked body SB further includes a fourth semiconductor film 40f. The fourth semiconductor film 40f includes $Al_{x4}Ga_{1-x4}N$ (0<x4≤1 and x2<x4). The $Al_{x4}Ga_{1-x4}N$ (0<x4≤1 and x2<x4) is provided on the second semiconductor film 20f.

Figure 3B:
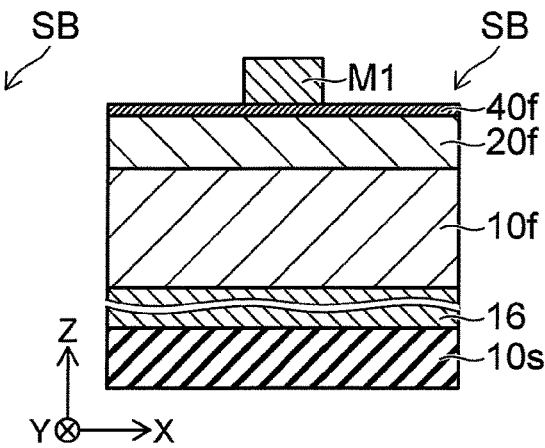

As shown in FIG. 3B, a mask M1 is formed on a portion of the stacked body SB. The mask M1 is, for example, a $SiO_2$ film. For example, the mask M1 is formed by photolithography and etching.

Figure 3C:
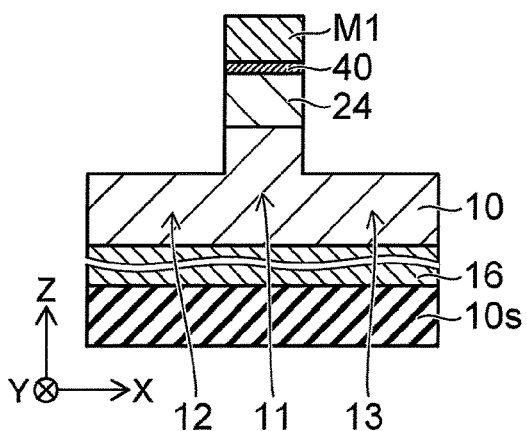

As shown in FIG. 3C, a portion of the second semiconductor film 20f and a portion of the first semiconductor film 10f are removed by using the mask M1 provided on the portion of the stacked body SB. In the case where the fourth semiconductor film 40f is provided, the removal of the portion of the second semiconductor film 20f and the portion of the first semiconductor film 10f includes removing a portion of the fourth semiconductor film 40f. In the removal, for example, etching (e.g., dry etching) is performed. For example, etching using $H_2$ gas may be performed inside a MOCVD apparatus. The etching is performed to a portion of the first semiconductor film 10f.

Thereby, the first semiconductor region 10 is formed from the first semiconductor film 10f. The first semiconductor region 10 includes the first to third partial regions 11 to 13. A portion of the first partial region 11 is positioned between the second partial region 12 and the third partial region 13 in the first direction (the X-axis direction). The first direction crosses the second direction (the Z-axis direction), which is from the first semiconductor film 10f toward the second semiconductor film 20f.

The fourth partial region 24 is formed from the second semiconductor film 20f between the first partial region 11 and the mask M1.

Figure 3D:
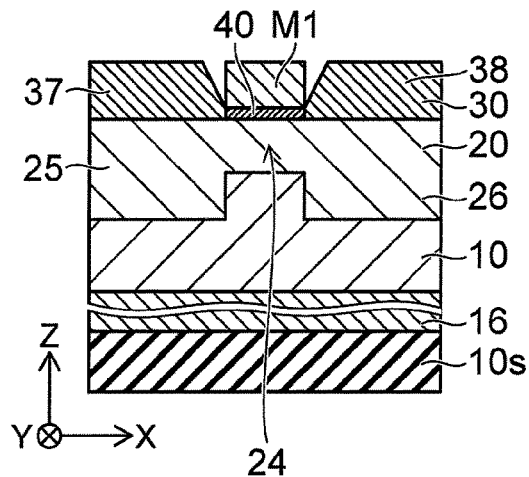

The fifth partial region 25 and the sixth partial region 26 are formed as shown in FIG. 3D. Namely, selective area regrowth of the crystal is performed. The fifth partial region 25 includes $Al_{x2}Ga_{1-x2}N$ (0≤x2<1 and x2<x1) and is positioned on the second partial region 12. The sixth partial region 26 includes $Al_{x2}Ga_{1-x2}N$ (0≤x2<1 and x2<x1) and is positioned on the third partial region 13. The fourth partial region 24, the fifth partial region 25, and the sixth partial region 26 are used to form the second semiconductor region 20.

The seventh partial region 37 and the eighth partial region 38 are further formed. The seventh partial region 37 includes $Al_{x3}Ga_{1-x3}N$ (0<x3≤1 and x2<x3) and is positioned on the fifth partial region 25. The eighth partial region 38 includes $Al_{x3}Ga_{1-x3}N$ (0<x3≤1 and x2<x3) and is positioned on the sixth partial region 26. The third semiconductor region 30 is formed from the seventh partial region 37 and the eighth partial region 38.

The mask is removed.

Figure 3E:
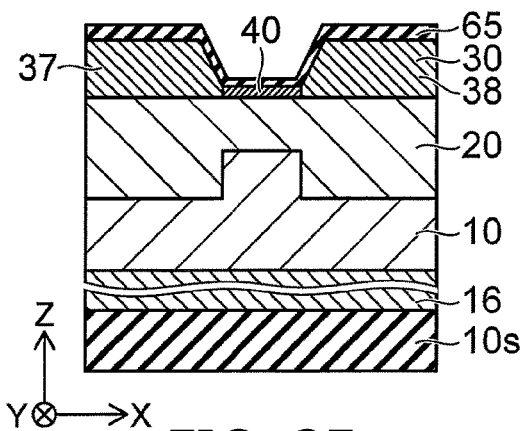

As shown in FIG. 3E, the insulating film 65 is formed on another portion (the remaining portion) of the second semiconductor film 20f. In the example, the insulating film 65 covers at least a portion of the third semiconductor region 30. The insulating film 65 covers at least a portion of the fourth semiconductor region 40. The insulating film 65 may not be provided on a portion of the seventh partial region 37 and on a portion of the eighth partial region 38. For example, a portion of the insulating film 65 is removed by etching, etc.

Figure 3F:
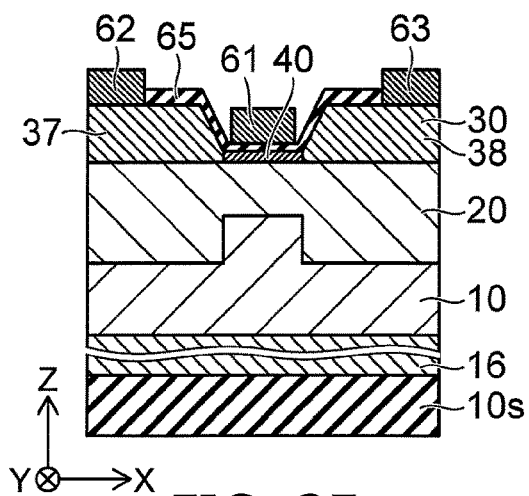

The first to third electrodes 61 to 63 are formed as shown in FIG. 3F. The first electrode 61 is positioned on the insulating film 65. The second electrode 62 is positioned on the seventh partial region 37. The third electrode 63 is positioned on the eighth partial region 38.

Thereby, the method for manufacturing the semiconductor device is performed.

In the manufacturing method recited above, processing such as etching or the like is not performed for the semiconductor region positioned under the gate electrode (the first electrode 61). Therefore, damage does not occur easily in the front surface of the semiconductor region. For example, in the case where the semiconductor film is etched in the region where the gate electrode is formed, this region is damaged easily. Thereby, for example, there are cases where the leakage current becomes large. For example, there are cases where the threshold voltage fluctuates easily. According to the manufacturing method recited above, the damage of the semiconductor film at this time can be suppressed; and a small leakage current is obtained. For example, the fluctuation of the threshold voltage can be small.

In the semiconductor device 110, the thickness of the first partial region 11 of the first semiconductor region 10 and the thickness of the fourth partial region 24 of the second semiconductor region 20 each can be controlled by the film thickness of the crystal growth. Therefore, the threshold voltage is controlled easily. In the second semiconductor region 20, the thicknesses of the fifth partial region 25 and the sixth partial region 26 each can be controlled by, for example, the etching depth of the first semiconductor film 10f. Therefore, the drain current is controlled easily. For example, the on-resistance is reduced easily.

In the semiconductor device 110, portions of the second semiconductor region 20 (the fourth partial region 24, the fifth partial region 25, and the sixth partial region 26) having mutually-different thicknesses can be formed according to the protrusion of the first semiconductor region 10. For example, the height of the protrusion corresponds to the thickness difference of the second semiconductor region 20. The thickness difference of the second semiconductor region 20 can be obtained with high controllability.

Figure 4A:
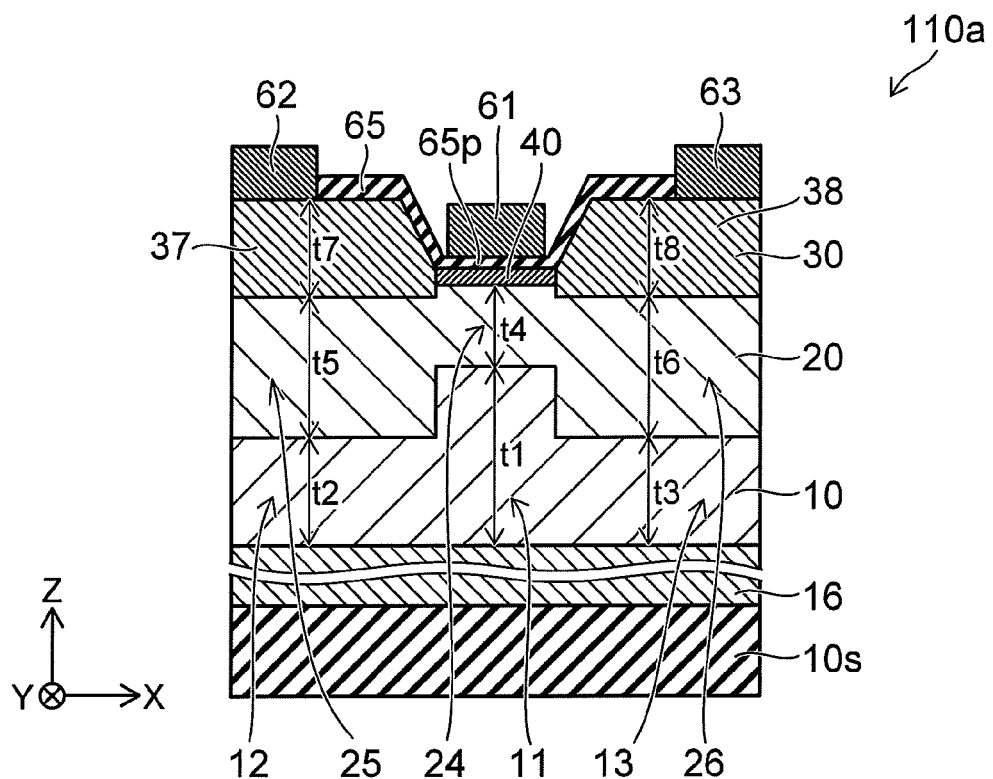
FIG. 4A and FIG. 4B are schematic cross-sectional views illustrating other semiconductor devices according to the first embodiment.
Figure 4B:
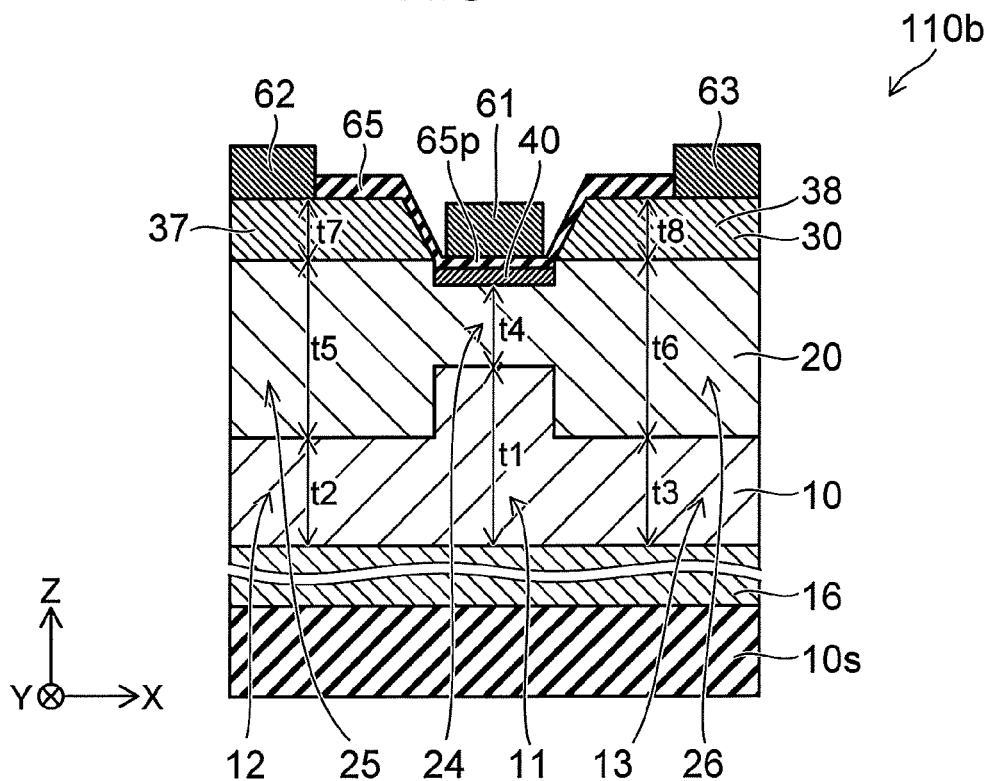

FIG. 4A and FIG. 4B are schematic cross-sectional views illustrating other semiconductor devices according to the first embodiment.

In a semiconductor device 110a according to the embodiment as shown in FIG. 4A, a portion of the fourth partial region 24 is between a portion of the seventh partial region 37 and a portion of the eighth partial region 38 in the X-axis direction (the first direction). For example, such a structure is formed in the case where the heights of the upper surfaces of the fifth partial region 25 and the sixth partial region 26 are lower than the upper surface of the fourth partial region 24 in the process described in reference to FIG. 3D. Otherwise, the configuration of the semiconductor device 110a is the same as the configuration of the semiconductor device 110.

In a semiconductor device 110b according to the embodiment as shown in FIG. 4B, at least a portion of the fourth semiconductor region 40 is between a portion of the fifth partial region 25 and a portion of the sixth partial region 26 in the X-axis direction (the first direction). For example, such a structure is formed in the case where the heights of the upper surfaces of the fifth partial region 25 and the sixth partial region 26 are higher than the upper surface of the fourth partial region 24 in the process described in reference to FIG. 3D. Otherwise, the configuration of the semiconductor device 110b is the same as the configuration of the semiconductor device 110.

In the semiconductor devices 110a and 110b as well, the on-resistance can be reduced. A high threshold voltage is obtained. A good normally-off characteristic is obtained.

Second Embodiment

Figure 5:
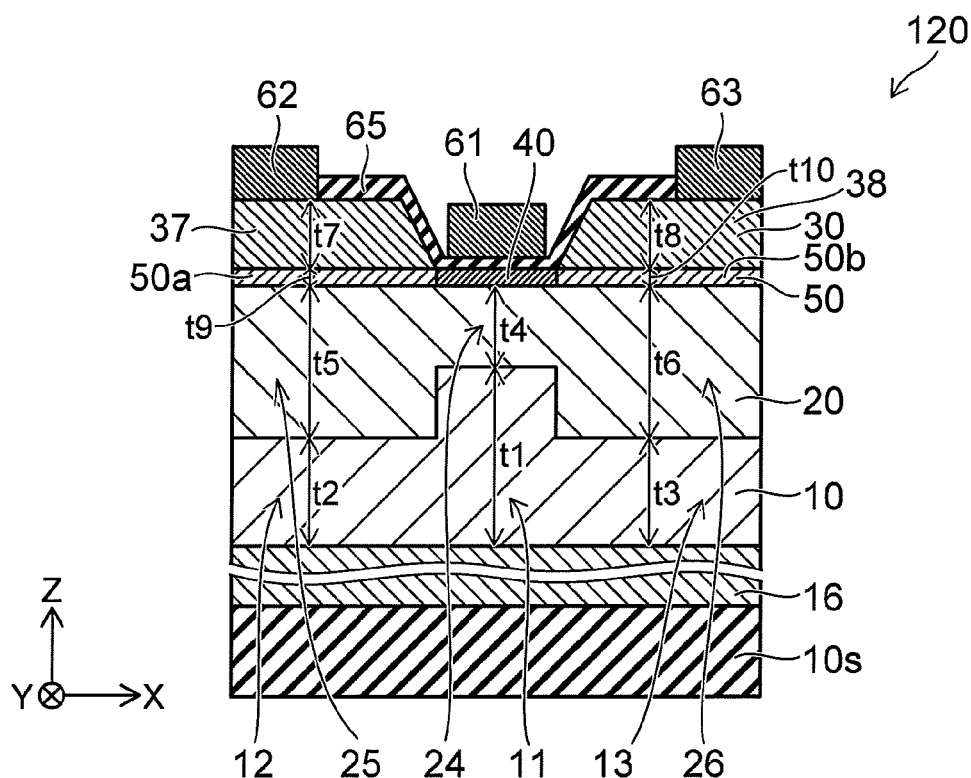
FIG. 5 is a schematic cross-sectional view illustrating a semiconductor device according to a second embodiment.

FIG. 5 is a schematic cross-sectional view illustrating a semiconductor device according to a second embodiment.

As shown in FIG. 5, the semiconductor device 120 according to the embodiment also includes the first to third electrodes 61 to 63, the first semiconductor region 10, the second semiconductor region 20, and the third semiconductor region 30. The fourth semiconductor region 40 is further provided in the example. A fifth semiconductor region 50 is further provided in the semiconductor device 120. Otherwise, the configuration of the semiconductor device 120 is the same as the configuration of the semiconductor device 110. An example of the fifth semiconductor region 50 will now be described.

The fifth semiconductor region 50 includes $Al_{x5}Ga_{1-x5}N$ (0<x5≤1 and x2<x5). The fifth semiconductor region 50 is, for example, AlGaN. The fifth semiconductor region 50 includes a ninth partial region 50a and the tenth partial region 50b. The ninth partial region 50a is provided between the fifth partial region 25 and the seventh partial region 37 in the second direction (the Z-axis direction). The tenth partial region 50b is provided between the sixth partial region 26 and the eighth partial region 38 in the second direction (the Z-axis direction).

For example, it is favorable for the Al composition ratio x5 of the fifth semiconductor region 50 to be lower than the Al composition ratio x3 of the third semiconductor region 30. The Al composition ratio x5 is, for example, not less than 0.05 and not more than 0.3.

For example, it is favorable for the Al composition ratio x5 of the fifth semiconductor region 50 to be not less than the Al composition ratio x4 of the fourth semiconductor region 40.

Thereby, for example, a two-dimensional electron gas forms easily in the vicinity region of the interface between the second semiconductor region 20 and the fifth semiconductor region 50 and the vicinity region of the interface between the fifth semiconductor region 50 and the third semiconductor region 30. Thereby, the number of paths (channel layers) where the electrons travel is two. The carrier concentration of the two-dimensional electron gas increases. Thereby, the drain current increases. In the semiconductor device 120, an even lower on-resistance is obtained.

It is favorable for the thickness of the fifth semiconductor region 50 to be thinner than the thickness of the third semiconductor region 30. For example, a ninth thickness t9 along the second direction (the Z-axis direction) of the ninth partial region 50a is thinner than the seventh thickness t7 along the second direction of the seventh partial region 37. For example, a tenth thickness t10 along the second direction of the tenth partial region 50b is thinner than the eighth thickness t8 along the second direction of the eighth partial region 38. Thereby, the carrier concentration of the two-dimensional electron gas occurring in the vicinity region of the interface between the second semiconductor region 20 and the fifth semiconductor region 50 increases. Thereby, an even lower on-resistance is obtained.

The ninth thickness t9 and the tenth thickness t10 each are, for example, not less than 2 nm and not more than 10 nm (e.g., about 5 nm).

The configurations described in reference to the semiconductor devices 110a and 110b are applicable to the semiconductor device 120.

Third Embodiment

Figure 6:
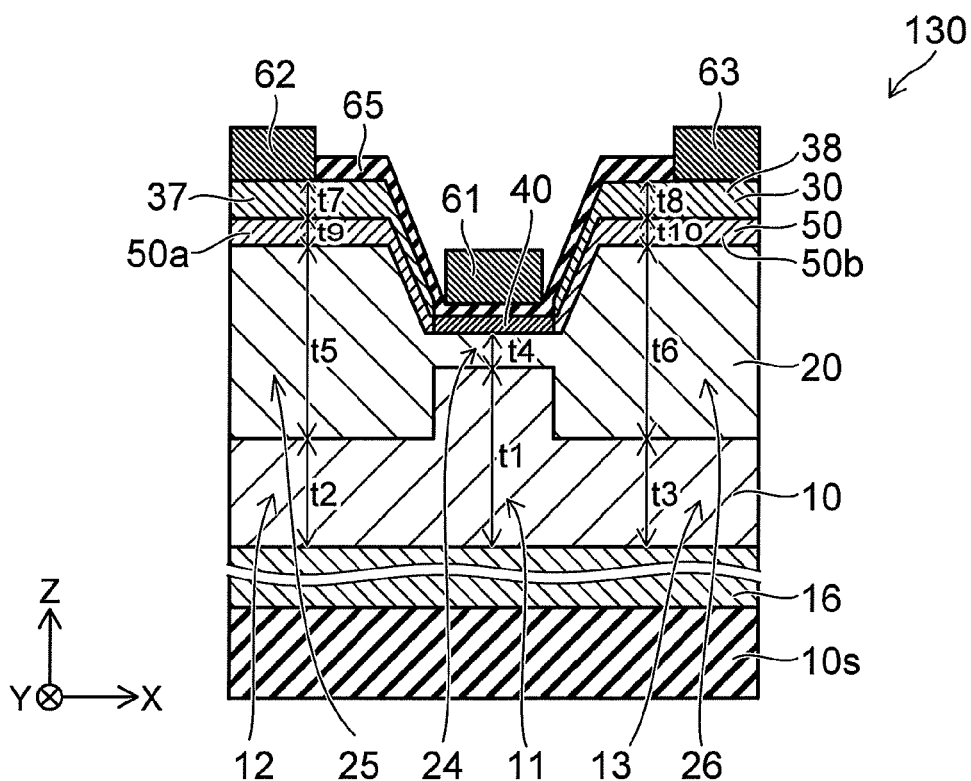
FIG. 6 is a schematic cross-sectional view illustrating a semiconductor device according to a third embodiment.

FIG. 6 is a schematic cross-sectional view illustrating a semiconductor device according to a third embodiment.

As shown in FIG. 6, the semiconductor device 130 according to the embodiment also includes the first to third electrodes 61 to 63, the first semiconductor region 10, the second semiconductor region 20, and the third semiconductor region 30. The fourth semiconductor region 40 and the fifth semiconductor region 50 are further provided in the example. In the semiconductor device 130, a recess is provided in the upper surface of the second semiconductor region 20; and the first electrode 61 is provided in the recess. Otherwise, the configuration of the semiconductor device 130 is the same as the configuration of the semiconductor device 120. An example of the recess of the second semiconductor region 20 and the structure of the periphery of the recess will now be described.

In the semiconductor device 130, at least a portion of the first electrode 61 is positioned between the fifth partial region 25 and the sixth partial region 26 in the first direction (the X-axis direction). For example, the fifth partial region 25 and the sixth partial region 26 are formed to be thick in the process relating to FIG. 3D. For example, the upper surface of the fifth partial region 25 and the upper surface of the sixth partial region 26 are positioned higher than the upper surface of the fourth partial region 24. In such a case, a recess (the fourth partial region 24) is formed in the second semiconductor region 20.

The fourth semiconductor region 40 is provided in the example. At least a portion of the fourth semiconductor region 40 may be positioned between the fifth partial region 25 and the sixth partial region 26 in the first direction (the X-axis direction).

In the semiconductor device 130 as well, the on-resistance can be reduced. A high threshold voltage is obtained. A good normally-off characteristic is obtained.

The embodiment may include the following configurations (e.g., technological proposals).

Configuration 1

A semiconductor device, comprising:
a first electrode;
a second electrode;
a third electrode, the third electrode being separated from the second electrode in a first direction, a position in the first direction of the first electrode being between a position in the first direction of the second electrode and a position in the first direction of the third electrode;
a first semiconductor region including $Al_{x1}Ga_{1-x1}N$ ($0<x1\leq1$), the first semiconductor region including a first partial region, a second partial region, and a third partial region, the first partial region being separated from the first electrode in a second direction crossing the first direction, the second partial region being separated from the second electrode in the second direction, the third partial region being separated from the third electrode in the second direction, a first thickness along the second direction of the first partial region being thicker than a second thickness along the second direction of the second partial region and thicker than a third thickness along the second direction of the third partial region;
a second semiconductor region including $Al_{x2}Ga_{1-x2}N$ ($0\leq x2<1$ and $x2<x1$), the second semiconductor region including a fourth partial region, a fifth partial region, and a sixth partial region, the fourth partial region being positioned between the first electrode and the first partial region in the second direction, the fifth partial region being positioned between the second electrode and the second partial region in the second direction, the sixth partial region being positioned between the third electrode and the third partial region in the second direction, a fourth thickness along the second direction of the fourth partial region being thinner than a fifth thickness along the second direction of the fifth partial region and thinner than a sixth thickness along the second direction of the sixth partial region; and
a third semiconductor region including $Al_{x3}Ga_{1-x3}N$ ($0<x3\leq1$ and $x2<x3$), the third semiconductor region including a seventh partial region and an eighth partial region, the seventh partial region being positioned between the second electrode and the fifth partial region in the second direction, the eighth partial region being positioned between the third electrode and the sixth partial region in the second direction.

Configuration 2

The semiconductor device according to Configuration 1, wherein the fourth thickness is not less than 0.1 times and not more than 0.5 times the fifth thickness.

Configuration 3

The semiconductor device according to Configuration 1 or 2, wherein the first thickness is not less than 2 times and not more than 10 times the second thickness.

Configuration 4

A semiconductor device, comprising:
a first electrode;
a second electrode;
a third electrode, the third electrode being separated from the second electrode in a first direction, a position in the first direction of the first electrode being between a position in the first direction of the second electrode and a position in the first direction of the third electrode;
a first semiconductor region including $Al_{x1}Ga_{1-x1}N$ ($0<x1\leq1$), the first semiconductor region including a first partial region, a second partial region, and a third partial region, the first partial region being separated from the first electrode in a second direction crossing the first direction, the second partial region being separated from the second electrode in the second direction, the third partial region being separated from the third electrode in the second direction;

a second semiconductor region including $Al_{x2}Ga_{1-x2}N$ (0≤x2<1 and x2<x1), the second semiconductor region including a fourth partial region, a fifth partial region, and a sixth partial region, the fourth partial region being positioned between the first electrode and the first partial region in the second direction, the fifth partial region being positioned between the second electrode and the second partial region in the second direction, the sixth partial region being positioned between the third electrode and the third partial region in the second direction; and a third semiconductor region including $Al_{x3}Ga_{1-x3}N$ (0<x3≤1 and x2<x3), the third semiconductor region including a seventh partial region and an eighth partial region, the seventh partial region being positioned between the second electrode and the fifth partial region in the second direction, the eighth partial region being positioned between the third electrode and the sixth partial region in the second direction, a portion of the first partial region being positioned between the fifth partial region and the sixth partial region in the first direction.

Configuration 5

The semiconductor device according to one of Configurations 1 to 4, further comprising an insulating film including a portion provided between the first electrode and the fourth partial region in the second direction.

Configuration 6

The semiconductor device according to one of Configurations 1 to 4, further comprising a fourth semiconductor region including $Al_{x4}Ga_{1-x4}N$ (0<x4≤1 and x2<x4) and being provided between the first electrode and the fourth partial region in the second direction.

Configuration 7

The semiconductor device according to Configuration 6, wherein the x4 is lower than the x3.

Configuration 8

The semiconductor device according to Configuration 6 or 7, wherein the x4 is not less than 0.1 and not more than 0.3.

Configuration 9

The semiconductor device according to one of Configurations 6 to 8, wherein a thickness along the second direction of the fourth semiconductor region is not less than 1 nm and not more than 10 nm.

Configuration 10

The semiconductor device according to one of Configurations 6 to 9, further comprising an insulating film including a portion provided between the first electrode and the fourth semiconductor region in the second direction.

Configuration 11

The semiconductor device according to one of Configurations 6 to 10, wherein at least a portion of the fourth semiconductor region in the first direction is positioned between the fifth partial region and the sixth partial region.

Configuration 12

The semiconductor device according to one of Configurations 1 to 11, further comprising a fifth semiconductor region including $Al_{x5}Ga_{1-x5}N$ (0<x5≤1 and x2<x5), the fifth semiconductor region including:

a ninth partial region provided between the fifth partial region and the seventh partial region in the second direction; and a tenth partial region provided between the sixth partial region and the eighth partial region in the second direction.

Configuration 13

The semiconductor device according to Configuration 12, wherein the x5 is lower than the x3.

Configuration 14

The semiconductor device according to Configuration 12 or 13, wherein a ninth thickness along the second direction of the ninth partial region is thinner than a seventh thickness along the second direction of the seventh partial region, and a tenth thickness along the second direction of the tenth partial region is thinner than an eighth thickness along the second direction of the eighth partial region.

Configuration 15

The semiconductor device according to one of Configurations 1 to 14, wherein the x3 is not less than 0.15 and not more than 0.5, and the seventh thickness along the second direction of the seventh partial region is not less than 5 nm and not more than 50 nm.

Configuration 16

The semiconductor device according to one of Configurations 1 to 15, wherein at least a portion of the first electrode is positioned between the fifth partial region and the sixth partial region in the first direction.

Configuration 17

The semiconductor device according to one of Configurations 1 to 16, further comprising:

a substrate; and a sixth semiconductor region including a nitride semiconductor including Al, the sixth semiconductor region being positioned between the substrate and the first semiconductor region in the second direction, the sixth semiconductor region contacting the substrate and the first semiconductor region.

Configuration 18

The semiconductor device according to one of Configurations 1 to 17, wherein the second electrode is electrically connected to the seventh partial region, and the third electrode is electrically connected to the eighth partial region.

Configuration 19

A method for manufacturing a semiconductor device, comprising:

removing a portion of a second semiconductor film and a portion of a first semiconductor film to form a first semiconductor region from the first semiconductor film by using a mask provided on a portion of a stacked body including the first semiconductor film and the second semiconductor film, the first semiconductor film including $Al_{x1}Ga_{1-x1}N$ (0<x1≤1), the second semiconductor film including $Al_{x2}Ga_{1-x2}N$ (0≤x2<1 and x2<x1) and being provided on the first semiconductor film, the first semiconductor region including first to third partial regions, a portion of the first partial region being positioned between the second partial region and the third partial region in a first direction, the first direction crossing a second direction, the second direction being from the first semiconductor film toward the second semiconductor film;

forming a fifth partial region and a sixth partial region, the fifth partial region including $Al_{x2}Ga_{1-x2}N$ (0≤x2<1 and x2<x1) and being positioned on the second partial region, the sixth partial region including $Al_{x2}Ga_{1-x2}N$ (0≤x2<1 and x2<x1) and being positioned on the third partial region;

forming a seventh partial region and an eighth partial region, the seventh partial region including $Al_{x3}Ga_{1-x3}N$ (0<x3≤1 and x2<x3) and being positioned on the fifth partial region, the eighth partial region including $Al_{x3}Ga_{1-x3}N$ ($0<x3\le1$ and $x2<x3$) and being positioned on the sixth partial region;

removing the mask;

forming an insulating film on another portion of the second semiconductor film; and forming a first electrode, a second electrode, and a third electrode, the first electrode being positioned on the insulating film, the second electrode being positioned on the seventh partial region, the third electrode being positioned on the eighth partial region.

Configuration 20

The method for manufacturing the semiconductor device according to Configuration 19, wherein the stacked body further includes a fourth semiconductor film including $Al_{x4}Ga_{1-x4}N$ ($0<x4\le1$ and $x2<x4$) and being provided on the second semiconductor film, and the removing of the portion of the second semiconductor film and the portion of the first semiconductor film includes removing a portion of the fourth semiconductor film.

According to the embodiments, a semiconductor device and a method for manufacturing the semiconductor device can be provided in which the decrease of the on-resistance is possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices such as electrodes, semiconductor regions, insulating films, substrates, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all semiconductor devices and methods for manufacturing the same practicable by an appropriate design modification by one skilled in the art based on the semiconductor devices and methods for manufacturing the same described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a second electrode;
   a third electrode, the third electrode being separated from the second electrode in a first direction, a position in the first direction of the first electrode being between a position in the first direction of the second electrode and a position in the first direction of the third electrode;
   a first semiconductor region including $Al_{x1}Ga_{1-x1}N$ ($0<x1\le1$), the first semiconductor region including a first partial region, a second partial region, and a third partial region, the first partial region being separated from the first electrode in a second direction perpendicular to the first direction, the second partial region being separated from the second electrode in the second direction, the third partial region being separated from the third electrode in the second direction, a first thickness along the second direction of the first partial region beneath the first electrode being thicker than a second thickness along the second direction of the second partial region beneath the second electrode and thicker than a third thickness along the second direction of the third partial region beneath the third electrode;
   a second semiconductor region including $Al_{x2}Ga_{1-x2}N$ ($0\le x2<1$ and $x2<x1$), the second semiconductor region including a fourth partial region, a fifth partial region, and a sixth partial region, the fourth partial region being positioned between the first electrode and the first partial region in the second direction, the fifth partial region being positioned between the second electrode and the second partial region in the second direction, the sixth partial region being positioned between the third electrode and the third partial region in the second direction, a fourth thickness along the second direction of the fourth partial region beneath the first electrode being thinner than a fifth thickness along the second direction of the fifth partial region beneath the second electrode and thinner than a sixth thickness along the second direction of the sixth partial region beneath the third electrode; and
   a third semiconductor region including $Al_{x3}Ga_{1-x3}N$ ($0<x3\le1$ and $x2<x3$), the third semiconductor region including a seventh partial region and an eighth partial region, the seventh partial region being positioned between the second electrode and the fifth partial region in the second direction, the eighth partial region being positioned between the third electrode and the sixth partial region in the second direction.

2. The semiconductor device according to claim 1, wherein the fourth thickness is not less than 0.1 times and not more than 0.5 times the fifth thickness.

3. The semiconductor device according to claim 1, wherein the first thickness is not less than 2 times and not more than 10 times the second thickness.

4. The semiconductor device according to claim 1, further comprising an insulating film including a portion provided between the first electrode and the fourth partial region in the second direction.

5. The semiconductor device according to claim 1, further comprising a fourth semiconductor region including $Al_{x4}Ga_{1-x4}N$ ($0<x4\le1$ and $x2<x4$) and being provided between the first electrode and the fourth partial region in the second direction.

6. The semiconductor device according to claim 5, wherein the x4 is lower than the x3.

7. The semiconductor device according to claim 5, wherein the x4 is not less than 0.1 and not more than 0.3.

8. The semiconductor device according to claim 5, wherein a thickness along the second direction of the fourth semiconductor region is not less than 1 nm and not more than 10 nm.

9. The semiconductor device according to claim 5, further comprising an insulating film including a portion provided between the first electrode and the fourth semiconductor region in the second direction.

10. The semiconductor device according to claim 5, wherein at least a portion of the fourth semiconductor region is positioned between the fifth partial region and the sixth partial region in the first direction.

11. The semiconductor device according to claim 1, further comprising a fifth semiconductor region including $Al_{x5}Ga_{1-x5}N$ ($0<x5\leq1$ and $x2<x5$),
the fifth semiconductor region including:
a ninth partial region provided between the fifth partial region and the seventh partial region in the second direction; and
a tenth partial region provided between the sixth partial region and the eighth partial region in the second direction.

12. The semiconductor device according to claim 11, wherein the x5 is lower than the x3.

13. The semiconductor device according to claim 11, wherein
a ninth thickness along the second direction of the ninth partial region is thinner than a seventh thickness along the second direction of the seventh partial region, and
a tenth thickness along the second direction of the tenth partial region is thinner than an eighth thickness along the second direction of the eighth partial region.

14. The semiconductor device according to claim 1, wherein
the x3 is not less than 0.15 and not more than 0.5, and
a seventh thickness along the second direction of the seventh partial region is not less than 5 nm and not more than 50 nm.

15. The semiconductor device according to claim 1, wherein at least a portion of the first electrode is positioned between the fifth partial region and the sixth partial region in the first direction.

16. The semiconductor device according to claim 1, further comprising:
a substrate; and
a sixth semiconductor region including a nitride semiconductor including Al,
the sixth semiconductor region being positioned between the substrate and the first semiconductor region in the second direction, the sixth semiconductor region contacting the substrate and the first semiconductor region.

17. The semiconductor device according to claim 1, wherein
the second electrode is electrically connected to the seventh partial region, and
the third electrode is electrically connected to the eighth partial region.

18. A semiconductor device, comprising:
a first electrode;
a second electrode;
a third electrode, the third electrode being separated from the second electrode in a first direction, a position in the first direction of the first electrode being between a position in the first direction of the second electrode and a position in the first direction of the third electrode;
a first semiconductor region including $Al_{x1}Ga_{1-x1}N$ ($0<x1\leq1$), the first semiconductor region including a first partial region, a second partial region, and a third partial region, the first partial region being separated from the first electrode in a second direction perpendicular to the first direction, the second partial region being separated from the second electrode in the second direction, the third partial region being separated from the third electrode in the second direction, a first thickness along the second direction of the first partial region beneath the first electrode being thicker than a second thickness along the second direction of the second partial region beneath the second electrode and thicker than a third thickness along the second direction of the third partial region beneath the third electrode;
a second semiconductor region including $Al_{x2}Ga_{1-x2}N$ ($0\leq x2<1$ and $x2<x1$), the second semiconductor region including a fourth partial region, a fifth partial region, and a sixth partial region, the fourth partial region being positioned between the first electrode and the first partial region in the second direction, the fifth partial region being positioned between the second electrode and the second partial region in the second direction, the sixth partial region being positioned between the third electrode and the third partial region in the second direction, a fourth thickness along the second direction of the fourth partial region beneath the first electrode being thinner than a fifth thickness along the second direction of the fifth partial region beneath the second electrode and thinner than a sixth thickness along the second direction of the sixth partial region beneath the third electrode; and
a third semiconductor region including $Al_{x3}Ga_{1-x3}N$ ($0<x3\leq1$ and $x2<x3$), the third semiconductor region including a seventh partial region and an eighth partial region, the seventh partial region being positioned between the second electrode and the fifth partial region in the second direction, the eighth partial region being positioned between the third electrode and the sixth partial region in the second direction,
a portion of the first partial region being positioned between the fifth partial region and the sixth partial region in the first direction.

* * * * *